US009570982B2

(12) United States Patent
Lin et al.

(10) Patent No.: US 9,570,982 B2
(45) Date of Patent: Feb. 14, 2017

(54) DC VOLTAGE GENERATION CIRCUIT AND PULSE GENERATION CIRCUIT THEREOF

(71) Applicant: REALTEK SEMICONDUCTOR CORPORATION, Hsinchu (TW)

(72) Inventors: Jian-Ru Lin, Nantou County (TW); Shih-Chieh Chen, Yilan County (TW); Chih-Cheng Lin, Hsinchu County (TW); Shih-Cheng Wang, Taichung (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 109 days.

(21) Appl. No.: 14/619,606

(22) Filed: Feb. 11, 2015

(65) Prior Publication Data

US 2015/0256075 A1 Sep. 10, 2015

(30) Foreign Application Priority Data

Mar. 10, 2014 (TW) .............................. 103108259 A

(51) Int. Cl.
*H02M 1/38* (2007.01)
*H02M 3/158* (2006.01)
*H03K 5/151* (2006.01)
*H03K 17/16* (2006.01)

(52) U.S. Cl.
CPC .............. *H02M 3/158* (2013.01); *H02M 1/38* (2013.01); *H03K 5/1515* (2013.01); *H03K 17/162* (2013.01)

(58) Field of Classification Search
CPC ...... H03K 5/1515; H03K 17/162; H02M 1/38; H02M 3/156; H02M 3/158; H02M 3/1582
USPC ....... 323/259, 263, 265, 268, 271, 282, 283; 327/102, 110, 111, 112, 208, 210, 214, 327/215, 217, 218, 219, 225, 291, 303, 327/304, 590
See application file for complete search history.

(56) References Cited

U.S. PATENT DOCUMENTS 6,114,889 A 9/2000 Lee
6,307,409 B1* 10/2001 Wrathall .......... H03K 17/08122
326/27
2010/0231270 A1 9/2010 Sasaki
2014/0139160 A1* 5/2014 Hattori .................. H03K 5/133
318/400.27

(Continued)

OTHER PUBLICATIONS

Office Action of the counterpart TW application 103108259 dated Apr. 24, 2015.

(Continued)

*Primary Examiner* — William Hernandez
(74) *Attorney, Agent, or Firm* — WPAT, P.C., Intellectual Property Attorneys; Anthony King

(57) ABSTRACT

A pulse generation circuit, for outputting a pulse signal at an output terminal, comprises a PMOS, an NMOS and a logic circuit. The PMOS has a source coupled to a first reference voltage level, a drain coupled to the output terminal, and a gate coupled to a first gate control signal. The NMOS has a source coupled to a second reference voltage level, a drain coupled to the output terminal, and a gate coupled to a second gate control signal. The logic circuit generates the first gate control signal according to a control signal and a first logic signal, relating to the second gate control signal and a delay signal of the second gate control signal, and generates the second gate control signal according to the control signal and a second logic signal, relating to the first gate control signal and a delay signal of the first control signal.

19 Claims, 10 Drawing Sheets

(56) References Cited

U.S. PATENT DOCUMENTS

2014/0253059 A1\* 9/2014 Tuten .................... G05F 1/10
                                                    323/271
2014/0347102 A1\* 11/2014 Teplechuk ........... H03K 5/1252
                                                    327/109
2015/0256076 A1\* 9/2015 Wang ...................... H03K 5/13
                                                    323/271

OTHER PUBLICATIONS

Search Report of the counterpart TW application 103108259 dated Apr. 24, 2015.
Abstract translation of the Office Action of the counterpart TW application 103108259 dated Apr. 24, 2015.
Office Action and Search Report dated Nov. 17, 2015 for counterpart Taiwan application No. 103108258.
English abstract translation of the Office Action dated Nov. 17, 2015 for counterpart Taiwan application No. 103108258.

\* cited by examiner

DC VOLTAGE GENERATION CIRCUIT AND PULSE GENERATION CIRCUIT THEREOF

BACKGROUND OF THE INVENTION

1. Field of the Invention

The present invention relates to a DC (Direct Current) voltage generation circuit and a pulse generation circuit thereof, especially to a DC voltage generation circuit and a pulse generation circuit thereof that prevent short current from occurring.

2. Description of Related Art

Please refer to FIG. 1, illustrating a circuit of a conventional switching regulator. The switching regulator 100 comprises a PMOS 110 and an NMOS 120, connecting in series between a DC voltage level Vcc and ground. The PMOS 110 has its source coupled to the DC voltage level Vcc and its drain coupled to the node LX, and the NMOS 120 has its source coupled to ground and its drain coupled to the node LX. The on/off state of the PMOS 110 is controlled by the gate control signal PG. When the gate control signal PG is at low level the PMOS 110 is on, and when the gate control signal PG is at high level the PMOS 110 is off. The on/off state of the NMOS 120 is controlled by the gate control signal NG. When the gate control signal NG is at high level the NMOS 120 is on, and when the gate control signal NG is at low level the NMOS 120 is off. The gate control signal PG and the gate control signal NG become a delay signal PD and a delay signal ND after passing through a delay unit 142 and a delay unit 132 respectively. The delay signal ND is inverted by a NOT gate 134 before being input to a NAND gate 136, which receives a control signal CTRL at its other terminal and outputs the gate control signal PG at its output terminal; similarly, the delay signal PD is inverted by a NOT gate 144 before being input to a NOR gate 146, which receives the control signal CTRL at its other terminal and outputs the gate control signal NG at its output terminal.

Please refer to FIG. 2, illustrating a timing diagram of the control signals and the delay signals of the conventional switching regulator 100. When the control signal CTRL transits from low level to high level (in order to turn on the PMOS 110), the gate control signal NG transits immediately from high level to low level, which immediately turns off the NMOS 120 to prevent the PMOS 110 and the NMOS 120 from turning on at the same time. After a delay time Td, the delay signal ND transits from high level to low level. As the inversion of the delay signal ND and the control signal CTRL both are at high level at the time, the gate control signal PG outputted by the NAND gate 136 transits to low level; namely, the PMOS 110 turns on at a delay time Td after the NMOS 120 turns off. After another delay time Td, the delay signal PD transits from high level to low level, reflecting the on state of the PMOS 110. After an enabling time Ton the control signal CTRL transits from high level to low level (in order to turn on the NMOS 120), which in turn makes the gate control signal PG transit immediately from low level to high level to turn off the PMOS 110 immediately so that the PMOS 110 and the NMOS 120 do not turn on at the same time. After the delay time Td, the delay signal PD transits from low level to high level. As the inversion of the delay signal PD and the control signal CTRL both are at low level at the time, the gate control signal NG outputted by the NOR gate 146 transits to high level; namely, the NMOS 120 turns on at the delay time Td after the PMOS 110 turns off. After another same delay time Td, the delay signal ND transits from low level to high level, reflecting the on state of the NMOS 120. As a result, continuous pulse signals are generated at the node LX by adjusting the duty cycle of the control signal CTRL. After the pulse signals pass through a low-pass filter 150, which is comprised of an inductor 152 and a capacitor 154, a DC voltage is generated at the output terminal OUT.

The feature of the circuit shown in FIG. 1 is that the gate control signal PG and the gate control signal NG are fed back to the NMOS 120 and the PMOS 110 respectively after a delay time so that when the gate control signal PG is at low level the gate control signal NG is not at high level, avoiding a short current caused by simultaneous turning on of both the PMOS 110 and the NMOS 120. Therefore, this kind of circuit is referred to as a feedback delay control circuit. This circuit, however, has a main drawback that when the enabling time Ton of the control signal CTRL is greater than the delay time Td but less than twice the delay time Td, (i.e., Td<Ton<2Td), there is a possibility that the PMOS 110 and the NMOS 120 turns on at the same time, resulting in the occurrence of the shout current. Please refer to FIG. 3, illustrating another timing diagram of the control signals and the delay signals of the conventional switching regulator 100. When the gate control signal PG transits from high level to low level to turn on the PMOS 110, the delay signal PD will not reflect the on state of the PMOS 110 until a delay time Td has elapsed. If, within the delay time Td, the control signal CTRL transits from high level to low level (in order to turn on the NMOS 120), despite the gate control signal PG transits immediately from low level to high level to turn off the PMOS 110 immediately, the gate control signal NG transits immediately from low level to high level since the delay signal PD is still at high level at the time, resulting in a simultaneous transition of both the gate control signal PG and the gate control signal NG, as depicted by the dotted circle in FIG. 3. As a result, because of inherent circuit delay of the components, a short current that damages the circuit components may probably occur during the transition time of both the gate control signal PG and the gate control signal NG when the PMOS 110 and the NMOS 120 turn on at the same time. In short, a short current will occur if the enabling time Ton or the non-enabling time of the control signal CTRL is less than twice the delay time Td.

SUMMARY OF THE INVENTION

In consideration of the imperfections of the prior art, an object of the present invention is to provide a DC voltage generation circuit and a pulse generation circuit thereof, so as to make an improvement to the prior art.

The present invention discloses a pulse generation circuit for generating a pulse signal at an output terminal, comprising: a PMOS having a source coupled to a first voltage level, a drain coupled to the output terminal, and a gate coupled to receive a first gate control signal; an NMOS having a source coupled to a second voltage level, a drain coupled to the output terminal, and a gate coupled to receive a second gate control signal; and a logic circuit, coupled to the gate of the PMOS and the gate of the NMOS, for generating the first gate control signal according to a control signal and a first logic signal and generating the second gate control signal according to the control signal and a second logic signal. The first logic signal is related to a first delay signal and the second gate control signal, the first delay signal being a delayed signal of the second gate control signal, and the second logic signal is related to a second delay signal and the first gate control signal, the second delay signal being a delayed signal of the first gate control signal.

The present invention also discloses a DC voltage generation circuit for generating a DC voltage, comprising: a low-pass filter, having an input terminal and an output terminal, for filtering a pulse signal to generate the DC voltage, which is outputted at the output terminal; a PMOS, having a source coupled to a first reference voltage level, a drain coupled to the input terminal of the low-pass filter, a gate coupled to receive a first gate control signal, the pulse signal being generated at the drain of the PMOS; an NMOS, having a source coupled to a second reference voltage level, a drain coupled to the input terminal of the low-pass filter, and a gate coupled to receive a second gate control signal, the pulse signal being generated at the drain of the NMOS; and a logic circuit, coupled to the gate of the PMOS and the gate of the NMOS, for generating the first gate control signal according to a control signal and a first logic signal and generating the second gate control signal according to the control signal and a second logic signal. The first logic signal is related to a first delay signal and the second gate control signal, the first delay signal being a delayed signal of the second gate control signal, and the second logic signal is related to a second delay signal and the first gate control signal, the second delay signal being a delayed signal of the first gate control signal.

The DC voltage generation circuit and the pulse generation circuit thereof calculate the total delay time on the feedback path. During the delay time, the gate control signal is not affected by the control signal CTRL and the delay signal; therefore even though the enabling or non-enabling time of the control signal is too short, the DC voltage generation circuit and the pulse generation circuit thereof can still avoid short currents.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The following description is written by referring to terms of this invention field. If any term is defined in the specification, such term should be explained accordingly. Besides, the connection between objects or events in the following embodiments can be direct or indirect provided that these embodiments are still applicable under such connection. Said "indirect" means that an intermediate object or a physical space exists between the objects, or an intermediate event or a time interval exists between the events. The present invention discloses a DC voltage generation circuit and the pulse generation circuit thereof, and the detail known in this field will be omitted if such detail has little to do with the features of the present invention. People of ordinary skill in the art can choose components or steps equivalent to those described in this specification to carry out the present invention, which means that the scope of this invention is not limited to the embodiments in the specification. On account of that some or all elements of said device invention could be known, the detail of such elements will be omitted provided that this omission nowhere dissatisfies the specification and enablement requirements.

Figure 1:
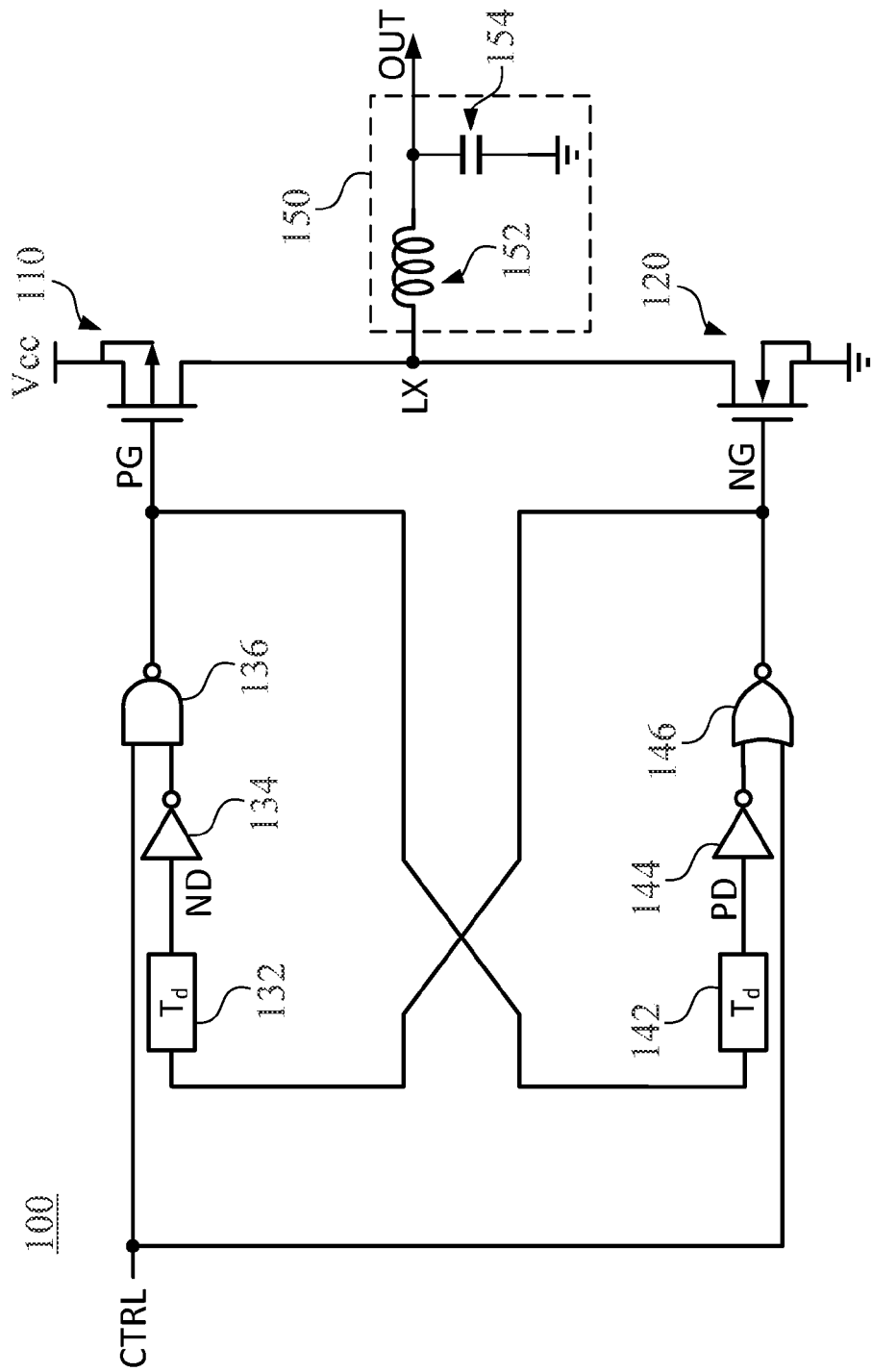
FIG. 1 illustrates a circuit of a conventional switching regulator.
Figure 2:
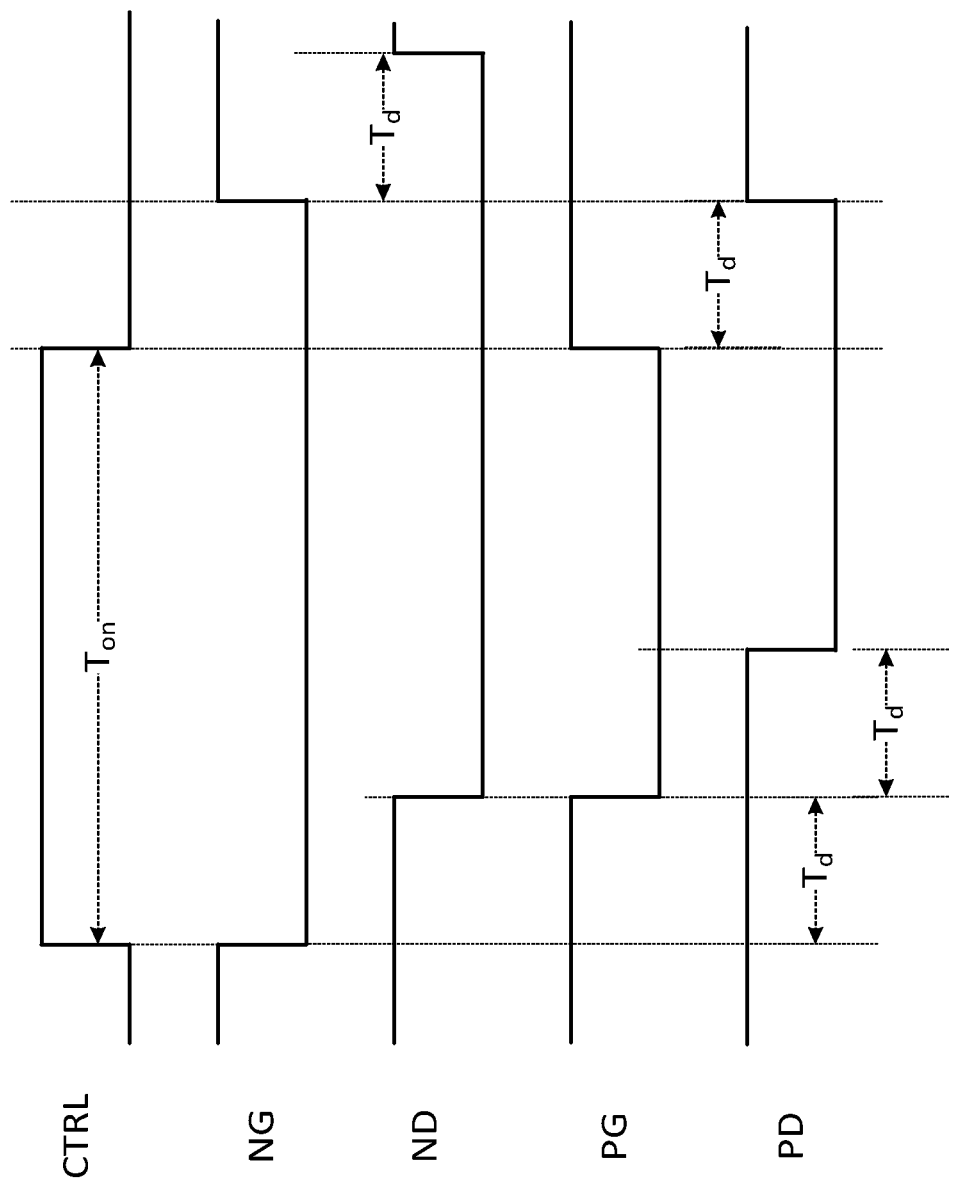
FIG. 2 illustrates a timing diagram of the control signals and the delay signals of the conventional switching regulator 100.
Figure 3:
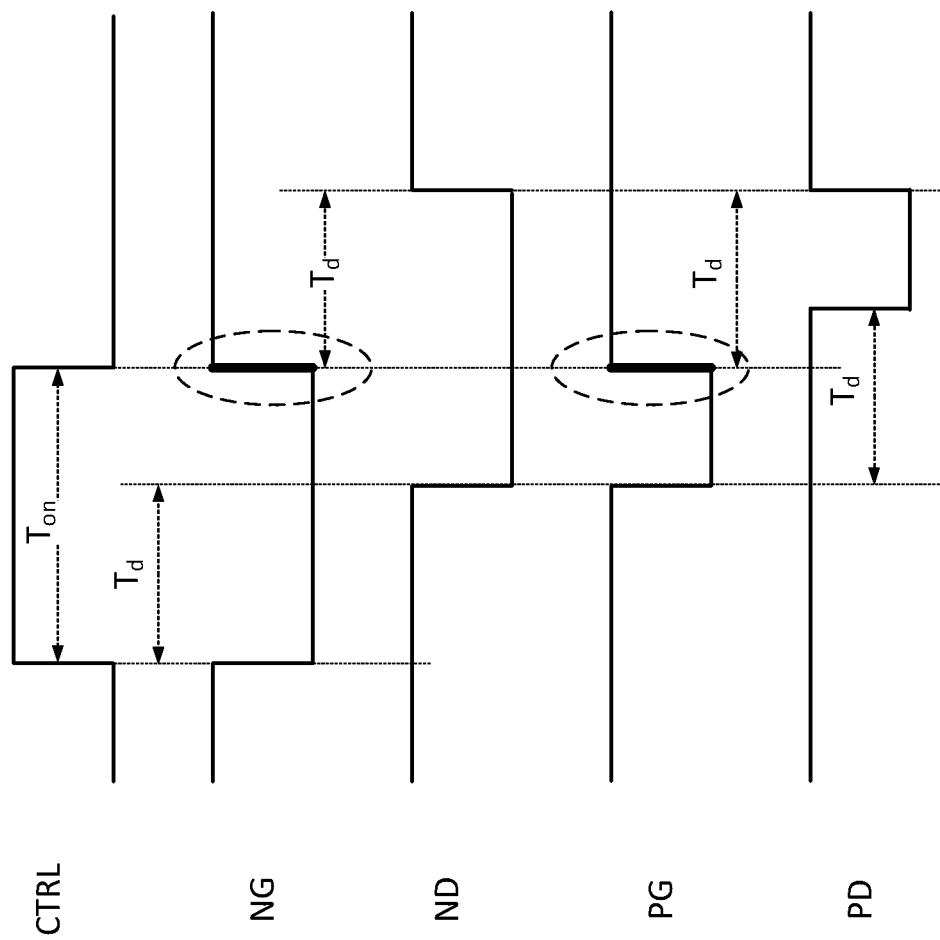
FIG. 3 illustrates another timing diagram of the control signals and the delay signals of the conventional switching regulator 100.
Figure 4:
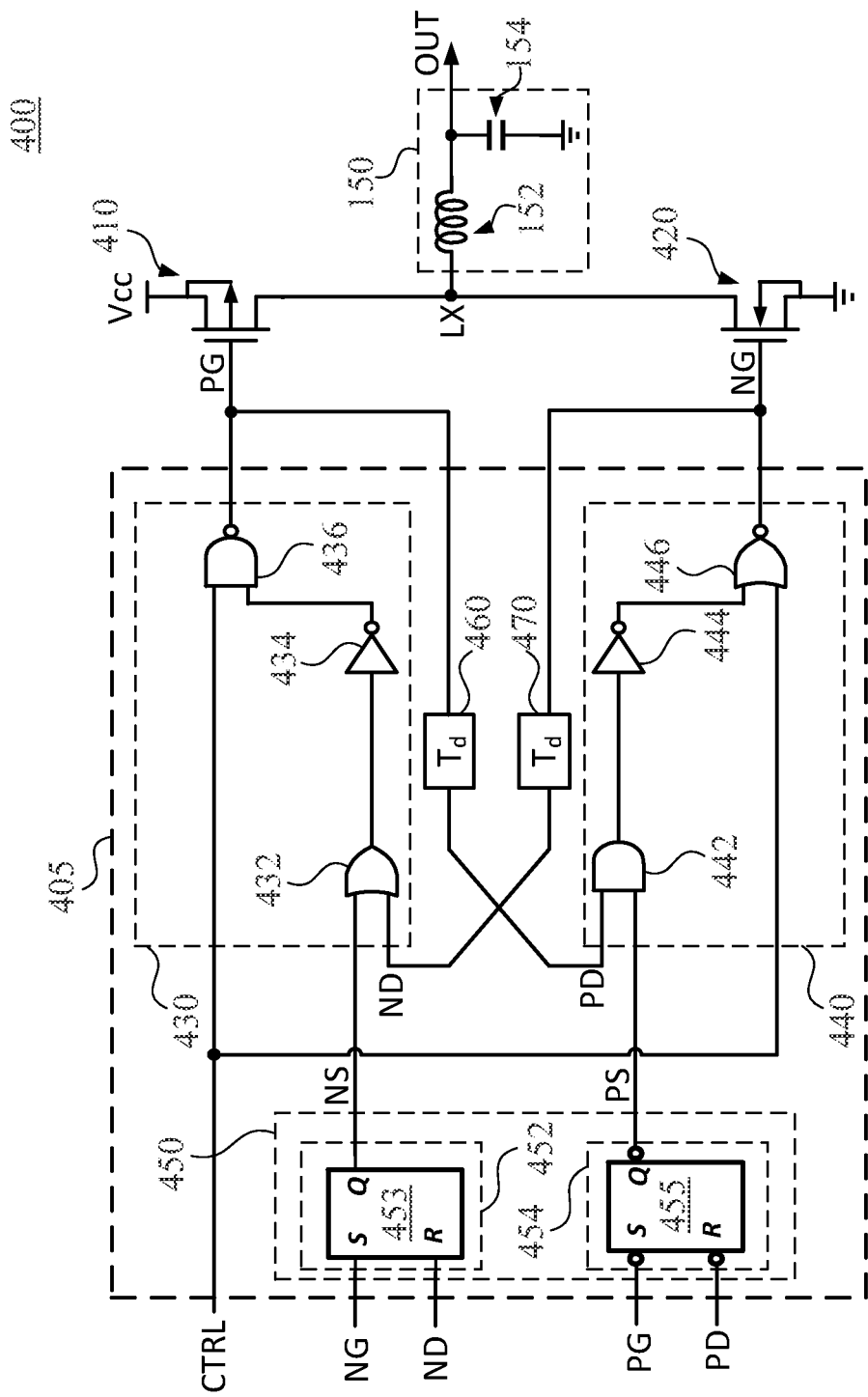
FIG. 4 illustrates a circuit of a switching regulator according to an embodiment of the present invention.

Please refer to FIG. 4, illustrating a circuit of a switching regulator according to an embodiment of the present invention. The switching regulator 400 comprises a PMOS 410 and an NMOS 420, which are connected in series between a DC voltage level Vcc and ground, a low-pass filter 150, and a logic circuit 405. The PMOS 410, the NMOS 420 and the logic circuit 405 together form a pulse generation circuit of the present invention, which generates pulse signals at the node LX. The PMOS 410 has its source coupled to the DC voltage level Vcc and its drain coupled to the node LX; the NMOS 420 has its source coupled to ground and its drain coupled to the node LX. The gates of the PMOS 410 and the NMOS 420 are coupled to the logic circuit 405, which outputs a gate control signal PG and a gate control signal NG to respectively control the on/off states of the PMOS 410 and the NMOS 420, and therefore pulse signals are generated at the node LX. A DC voltage is formed at the output terminal OUT after the pulse signals are filtered by the low-pass filter 150. Generally, the PMOS 410, the NMOS 420 and the logic circuit 405 locate inside a chip, while the low-pass filter 150 locates outside the chip and is connected to the chip via wirings on a circuit board. In other embodiments, the PMOS 410, the NMOS 420, the logic circuit 405 and the low-pass filter 150 can be all implemented inside a chip.

The logic circuit 405 comprises a logic unit 430, a logic unit 440, and a logic unit 450. The logic circuit 405 generates the gate control signal PG according to a control signal CTRL, a logic signal NS and a delay signal ND. The logic signal NS is a logic operation result of the logic unit 450 based on the gate control signal NG and its delay signal ND. The logic circuit 405 generates the gate control signal NG according to the control signal CTRL, a logic signal PS, and a delay signal PD. The logic signal PS is a logic operation result of the logic unit 450 based on the gate control signal PG and its delay signal PD. Therefore, the gate control signal PG is actually a logic operation result of the logic circuit 405 based on the control signal CTRL, the gate control signal NG and the delay signal ND, and the gate control signal NG is actually a logic operation result of the logic circuit 405 based on the control signal CTRL, the gate control signal PG and the delay signal PD. The logic units included in the logic circuit 405 will be detailed below.

The logic unit 430, which is coupled to the gate of the PMOS 410, comprises an OR gate 432, a NOT gate 434, and a NAND gate 436. The OR gate 432 receives the logic signal NS and the delay signal ND, and the output signal of the OR gate 432 is inverted by the NOT gate 434 before being inputted to one input terminal of the NAND gate 436, which receives the control signal CTRL at its other input terminal and outputs the gate control signal PG at its output terminal. The logic unit 440, which is coupled to the gate of the NMOS 420, comprises an AND gate 442, a NOT gate 444, and a NOR gate 446. The AND gate 442 receives the logic signal PS and the delay signal PD, and the output signal of the AND gate 442 is inverted by the NOT gate 444 before being inputted to one input terminal of the NOR gate 446, which receives the control signal CTRL at its other input terminal and outputs the gate control signal NG at its output terminal. The a logic circuit 405 further comprises a delay unit 460 and a delay unit 470, both being designed to have delay time Td. The delay unit 460 is coupled to the gate of the PMOS 410, for delaying the gate control signal PG to form the delay signal PD; and the delay unit 470 is coupled to the gate of the NMOS 420, for delaying the gate control signal NG to form the delay signal ND. The logic unit 450 is coupled to the logic unit 430, the logic unit 440, the delay unit 460, the delay unit 470, the gate of the PMOS 410, and the gate of the NMOS 420. A main function of the logic unit 450 is to generate the logic signal NS according to the gate control signal NG and the delay signal ND and to generate the logic signal PS according to the gate control signal PG and the delay signal PD. The logic unit 450 comprises a sub-logic unit 452 and a sub-logic unit 454. The sub-logic unit 452 performs a logic operation on the gate control signal NG and the delay signal ND and outputs the logic signal NS accordingly; and the sub-logic unit 454 performs a logic operation on the gate control signal PG and the delay signal PD and outputs the logic signal PS accordingly. A main function of the sub-logic unit 452 is to calculate a delay time from the gate control signal NG making a transition from low level to high level to the delay signal ND actually reflecting this transition; namely, the sub-logic unit 452 calculates a delay time from the a logic circuit 405 controlling the NMOS 420 to turn on to the delay signal ND actually reflecting the on-state of the NMOS 420. Similarly, a main function of the sub-logic unit 454 is to calculate a delay time from the gate control signal PG making a transition from high level to low level to the delay signal PD actually reflecting this transition; namely, the sub-logic unit 454 calculates a delay time from the a logic circuit 405 controlling the PMOS 410 to turn on to the delay signal PD actually reflecting the on-state of the PMOS 410.

Figure 5:
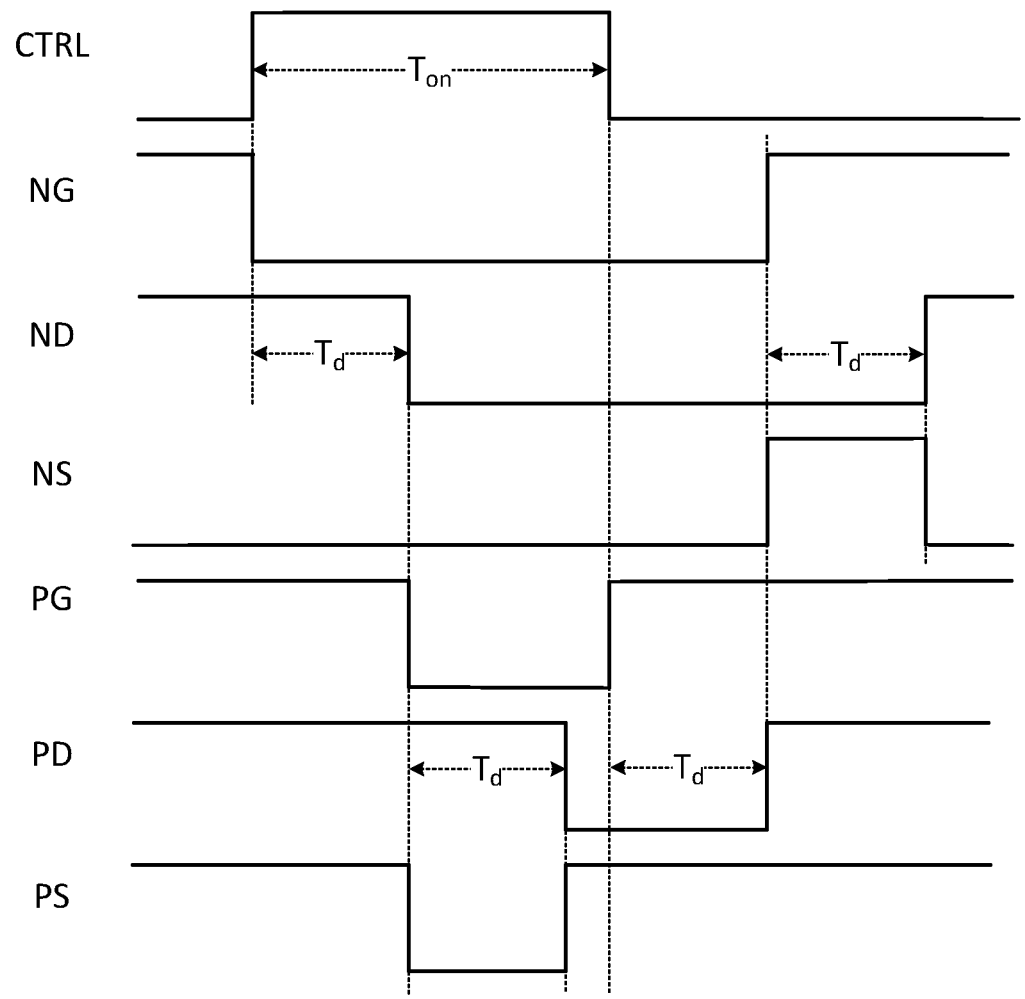
FIG. 5 illustrates the control signals, the delay signals, and the logic signals of the switching regulator 400 according to an embodiment of the present invention.

Please refer to FIG. 5, illustrating the control signals, the delay signals, and the logic signals of the switching regulator 400 according to an embodiment of the present invention. When the control signal CTRL transits from low level to high level (in order to turn on the PMOS 410), the gate control signal NG transits immediately, under the control of logic unit 440, from high level to low level to turn off the NMOS 420. After a delay time Td, the delay signal ND also transits from high level to low level. During the delay time Td, the logic signal NS keeps at low level. The logic unit 430 controls the gate control signal PG to transit from high level to low level according to the high level control signal CTRL, the low level logic signal NS, and the low level delay signal ND, and therefore the PMOS 410 turns on accordingly. After a delay time Td, the delay signal PD also transits from high level to low level to reflect the turning on of the PMOS 410. During the delay time Td, the PMOS 410 is actually turned on whereas the delay signal PD does not reflect that fact immediately, which may probably results in a short current if the NMOS 420 is mistakenly turned on during that delay time Td. To prevent this situation from happening, the sub-logic unit 454 is provided to generate the logic signal PS that indicates the asynchronous time between the gate control signal PG and the delay signal PD. In this embodiment, the logic signal PS keeps at low level during this asynchronous time, which makes the AND gate 442 ignore the delay signal PD and thus the output signal of the AND gate 442 is also at low level, indirectly making the NOR gate 446 ignore the control signal CTRL. As a result, the NMOS 420 will not be turned on by mistake when the logic signal PS is at low level. When the control signal CTRL transits from high level to low level (in order to turn on the NMOS 420), the gate control signal PG transits immediately, under the control of the logic unit 430, from low level to high level to turn off the PMOS 410. After a delay time Td, the delay signal PD also transits from low level to high level. During the delay time Td, the logic signal PS keeps at high level. The logic unit 440 controls the gate control signal NG to transit from low level to high level according to the low level control signal CTRL, the high level logic signal PS, and the high level delay signal PD, and therefore the NMOS 420 turns on accordingly. After a delay time Td, the delay signal ND also transits from low level to high level to reflect the turning on of the NMOS 420. Similarly, to prevent the PMOS 410 from being turned on by mistake during the delay time Td, the sub-logic unit 452 is provided to generate the logic signal NS according to the gate control signal NG and the delay signal ND. In this embodiment, the high level logic signal NS makes the OR gate 432 ignore the delay signal ND and indirectly makes the NAND gate 436 ignore the control signal CTRL. As a result, the PMOS 410 will not be turned on by mistake when the logic signal NS is at high level.

Figure 6:
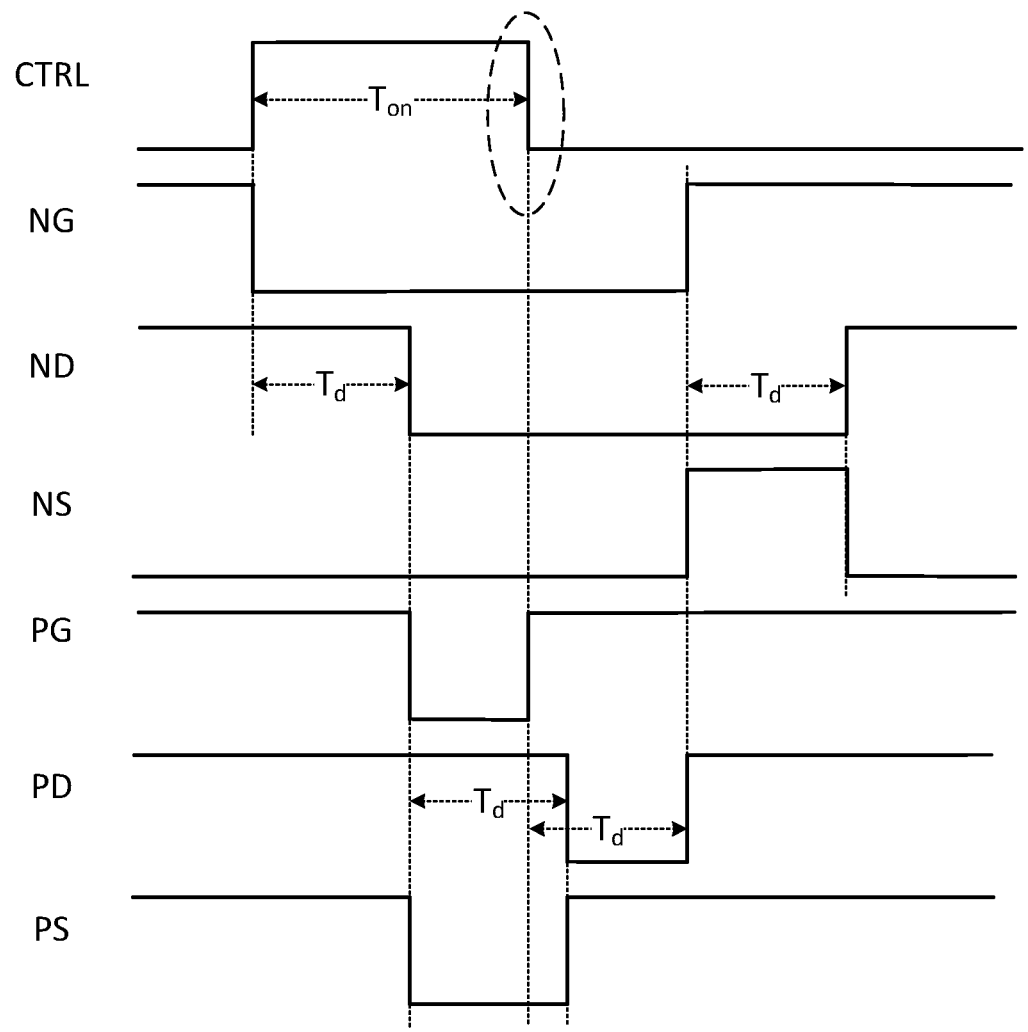
FIG. 6 illustrates the control signals, the delay signals, and the logic signals of the switching regulator 400 according to another embodiment of the present invention.

Please refer to FIG. 6, illustrating the control signals, the delay signals, and the logic signals of the switching regulator 400 according to another embodiment of the present invention. As mentioned above, when the enabling time Ton of the control signal CTRL is larger than the delay time Td but less than 2Td, as depicted by the dotted circle, the gate control signal NG will not transit in view of the logic signal PS, and after the delay signal PD actually reflects the turning off of the PMOS 410, the gate control signal NG transits from low level to high level to control the NMOS 420 to turn on. Therefore, the switching regulator 400 of the present invention addresses the problem encountered by the conventional switching regulator 100. The above description is made by taking the enabling time Ton of the control signal CTRL as an example; however, it also applies when the non-enabling time of the control signal CTRL is larger than the delay time Td but less than 2Td, which can be understood by people having ordinary skill in the art, and the related description is therefore omitted for brevity.

Figure 7:
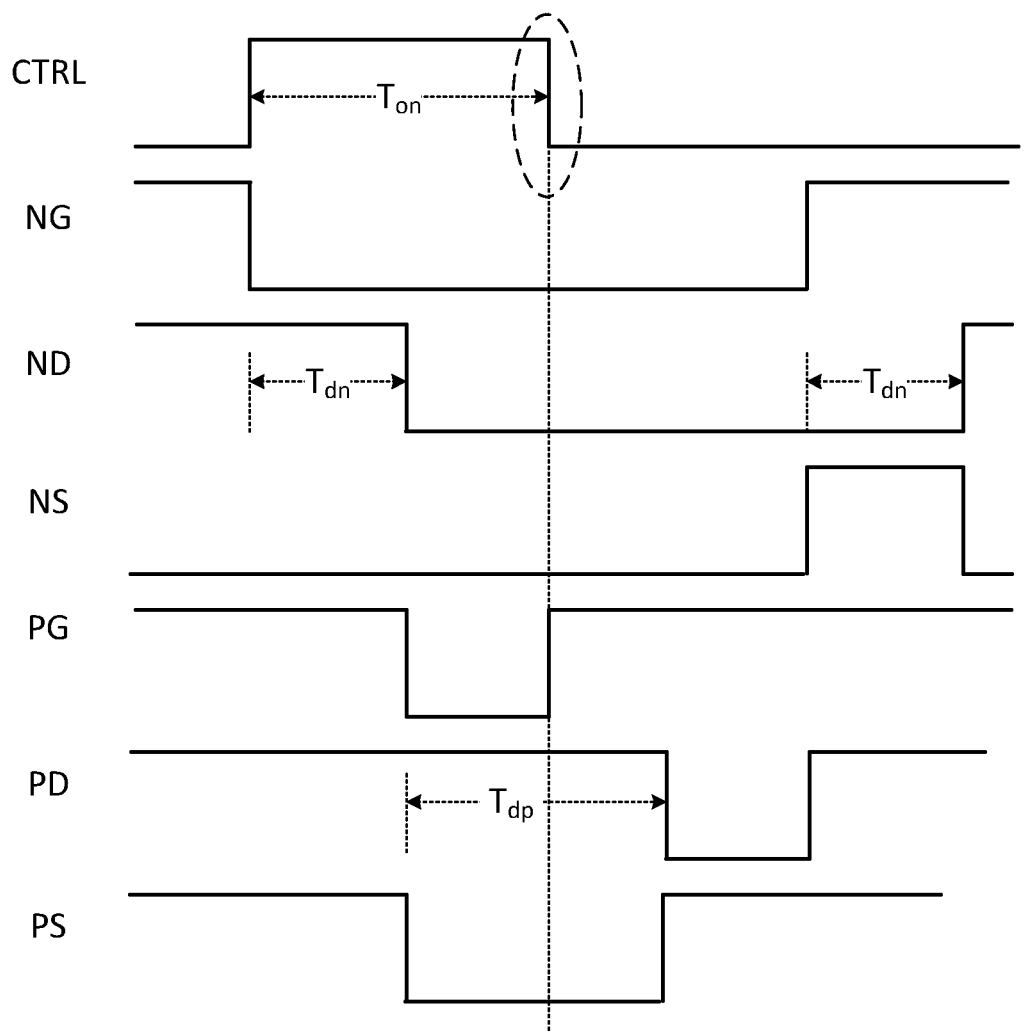
FIG. 7 illustrates the control signals, the delay signals, and the logic signals of the switching regulator 400 according to another embodiment of the present invention.

Although the delay unit 460 and the delay unit 470 are designed to have the same delay time, the practical delay time Tdp of the delay unit 460 and the practical delay time Tdn of the delay unit 470 are probably not identical because of variations in the manufacturing process and the environment. In this case, because the switching regulator 400 of the present invention uses the sub-logic unit 452 (454) to calculate the practical delay between the gate control signal NG (PG) and the delay signal ND (PD), the switching regulator 400 can still function properly without being affected by the inconsistency between the delay time Tdn and the delay time Tdp. Please refer to FIG. 7, illustrating the control signals, the delay signals, and the logic signals of the switching regulator 400 according to another embodiment of the present invention. Because the logic signal PS is able to reflect the delay between the gate control signal PG and the delay signal PD, the NMOS 420 will not be turn on by mistake during the delay time even if the control signal CTRL transits from high to low level, as depicted by the dotted circle. The logic signal NS has corresponding effect, and the related description is omitted since it can be understood by people having ordinary skill in the art based on the above disclosure.

Figure 8:
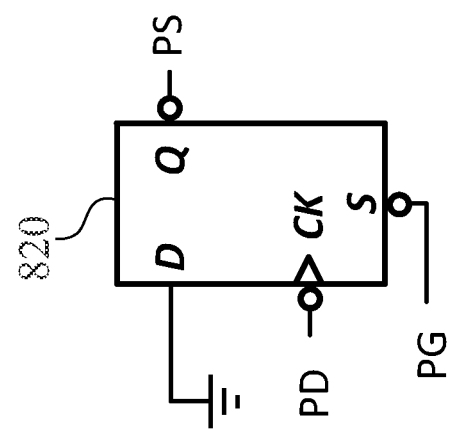
FIG. 8 illustrates the sub-logic units implemented by D Flip Flops according to an embodiment of the present invention.
Figure 8:
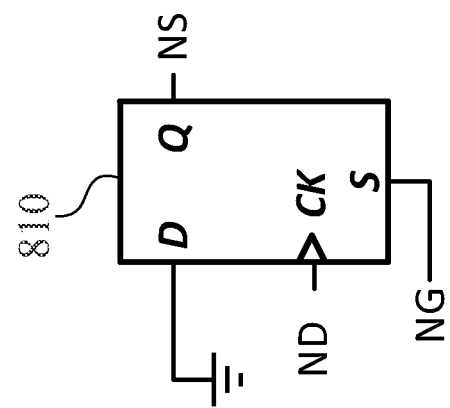

The sub-logic unit 452 is implemented by an SR latch 453, which receives the gate control signal NG at its set input S, receives the delay signal ND at its reset input R, and outputs the logic signal NS at its in-phase output Q. The sub-logic unit 454 is implemented by an SR latch 455, which receives an inversion of the gate control signal PG at its set input S, an inversion of the delay signal PD at its reset input R, and outputs an inversion of the logic signal PS at its in-phase output Q. The implementation of the sub-logic unit 452 and the sub-logic unit 454 is not limited to SR latches 453 and 455, and they can also be, for example, implemented by a D Flip Flop 810 and a D Flip Flop 820 shown in FIG. 8 respectively. The D Flip Flop 810 has its data input D coupled to ground, its clock input CK coupled to the delay signal ND and its set input S coupled to the gate control signal NG and outputs the logic signal NS at its in-phase output Q. The D Flip Flop 820 has its data input D coupled to ground, its clock input CK coupled to an inversion of the delay signal PD, and its set input S coupled to an inversion of the gate control signal PG, and an inversion of the output signal at its in-phase output Q becomes the logic signal PS. The operations of the D Flip Flop are well known to people having ordinary skill in the art and therefore are omitted for brevity.

Figure 9:
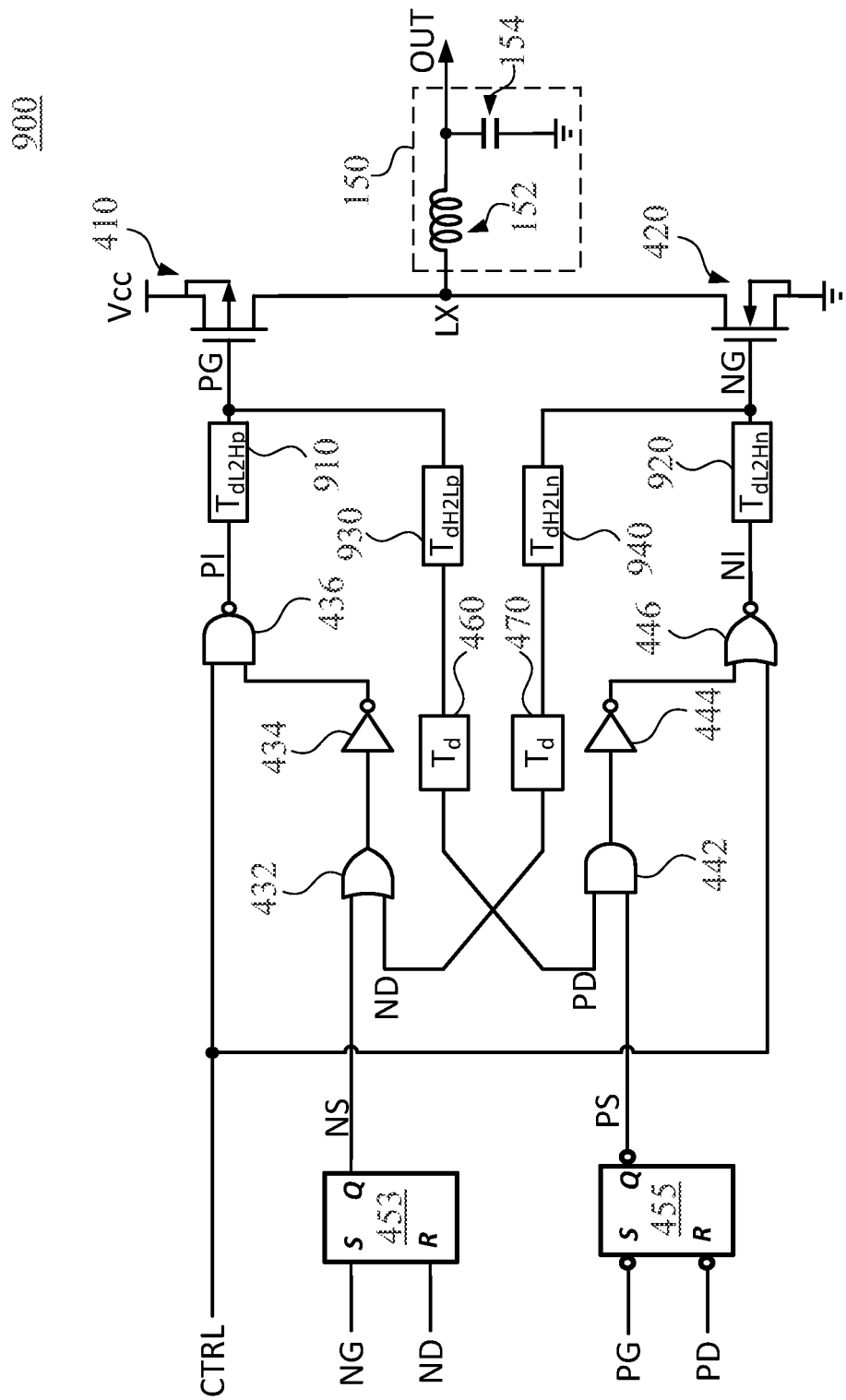
FIG. 9 illustrates a circuit of a switching regulator 900 with buck-boost converters of the present invention.
Figure 10:
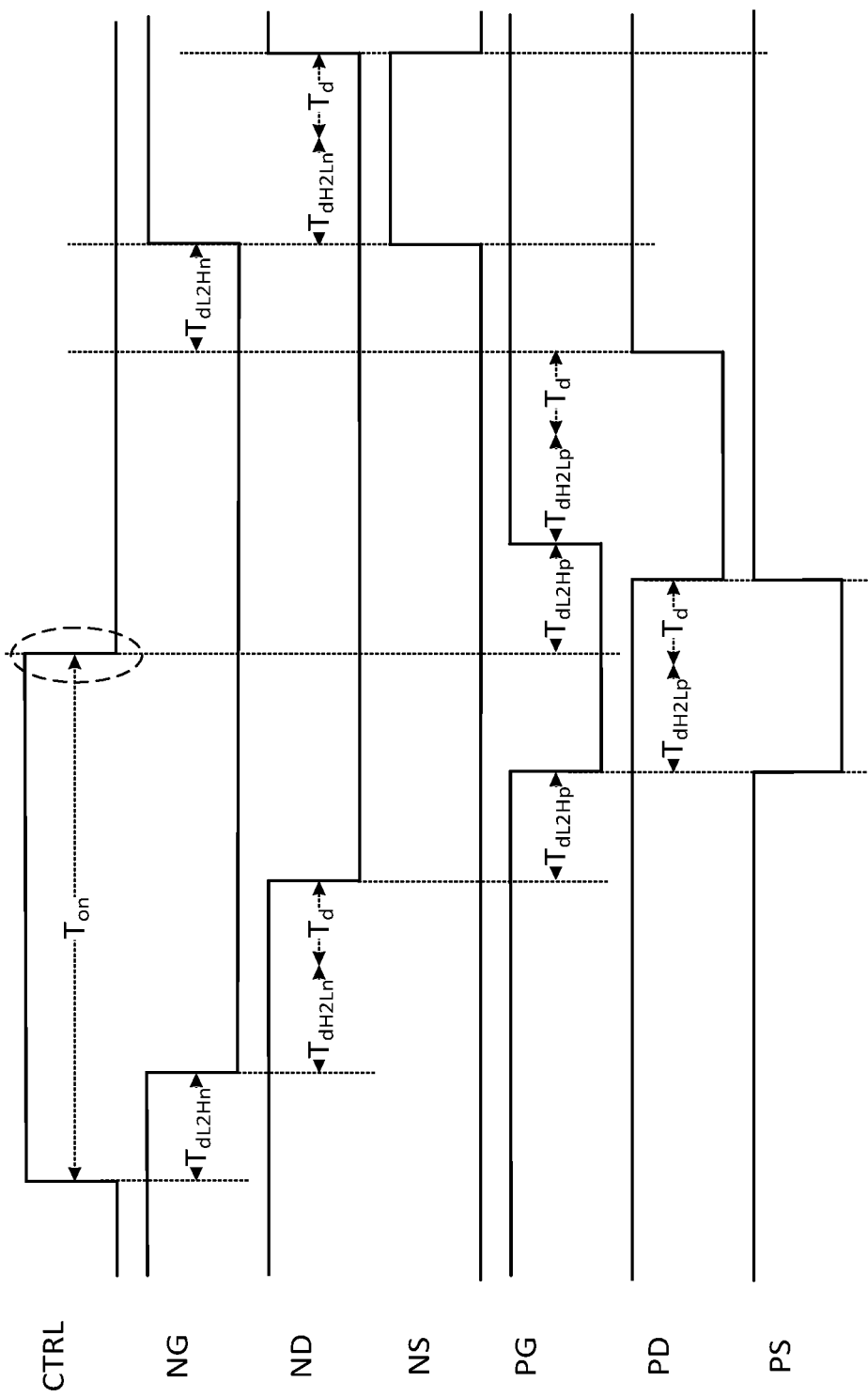
FIG. 10 illustrates the control signals, the delay signals, and the logic signals of the switching regulator 900 according to an embodiment of the present invention.

Please refer to FIG. 9, illustrating a circuit of a switching regulator 900 with buck-boost converters of the present invention. A boost converter 910 is to boost a logic signal PI outputted by the NAND gate 436 to form the gate control signal PG, and a boost converter 920 is to boost a logic signal NI outputted by the NOR gate 446 to form the gate control signal NG. The delay time of the boost converter 910 and the boost converter 920 are TdL2Hp and TdL2Hn respectively. On the other hand, a buck converter 930 and a buck converter 940 are to respectively buck voltages of the gate control signal PG and the gate control signal NG and have delay time of TdH2Lp and TdH2Ln, respectively. Please refer to FIG. 10, illustrating the control signals, the delay signals, and the logic signals of the switching regulator 900 according to an embodiment of the present invention. The parasitic delays of the boost/buck converters 910~940 are shown on their corresponding signals. For example, when the control signal CTRL transits from low level to high level, the gate control signal NG transits after a delay time TdL2Hn, and a delay time between the delay signal ND and the gate control signal NG is TdH2Ln+Td. When the buck converter 930 has a parasitic delay, the logic signal PS is able to reflect the parasitic delay time TdH2Lp; namely, even if the control signal CTRL transits from high level to low level during this delay time, the NMOS 420 will not be turned on by mistake. Similarly, the logic signal NS can also reflect the parasitic delay time TdH2Ln of the buck converter 940. In short, the SR latch 453 (or the sub-logic unit 452 of FIG. 4) is able to calculate all delays on a feedback path from the gate of the NMOS 420 to the OR gate 432, and during the total delay time the logic signal PI is not affected by the control signal CTRL and the delay signal ND; similarly, the SR latch 455 (or the sub-logic unit 454 of FIG. 4) is able to calculate all delays on a feedback path from the gate of the PMOS 410 to the AND gate 442, and during the total delay time the logic signal NI is not affected by the control signal CTRL and the delay signal PD.

As previously mentioned, the switching regulator of this invention can not only overcome the difference between the delay times of the delay unit 460 and the delay unit 470 due to variations in the manufacturing process and the environment but also overcome the parasitic delays of the boost/buck converters 910~940; therefore, the short current is prevented from happening in a more comprehensive way.

Although in the aforementioned embodiments the gate control signal NG is designed not to be at high level when the gate control signal PG is at low level, i.e., the gate control signals PG/NG are designed not to respectively be at low/high levels at the same time, these embodiments are not limited to using NMOS or PMOS as switches. Besides, a slight modification to the circuit will yield different combinations of signal levels to control the switches; for example by adding a NOT gate to the output terminal of the NAND gate 436 and/or the NOR gate 446, or replacing the NAND gate 436 with an AND gate and/or replacing the NOR gate 446 with an OR gate will make the gate control signals PG/NG not respectively at low/low, high/low and high/high levels at the same time. Other kinds of modifications can be perceived by people having ordinary skill in the art according to the disclosures of the present invention and are therefore omitted for brevity.

Please note that the shape, size, and ratio of any element in the disclosed figures are just exemplary for understanding, not for limiting the scope of this invention. Besides, each aforementioned embodiment may include one or more features; however, this doesn't mean that one carrying out the present invention should make use of all the features of one embodiment at the same time, or should only carry out different embodiments separately. In other words, if an implementation derived from one or more of the embodiments is applicable, a person of ordinary skill in the art can selectively make use of some or all of the features in one embodiment or selectively make use of the combination of some or all features in several embodiments to have the implementation come true, so as to increase the flexibility of carrying out the present invention.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A pulse generation circuit for generating a pulse signal at an output terminal, comprising:
   a PMOS having a source coupled to a first voltage level, a drain coupled to the output terminal, and a gate coupled to receive a first gate control signal;
   an NMOS having a source coupled to a second voltage level, a drain coupled to the output terminal, and a gate coupled to receive a second gate control signal; and
   a logic circuit, coupled to the gate of the PMOS and the gate of the NMOS, for generating the first gate control signal according to a control signal and a first logic signal and generating the second gate control signal according to the control signal and a second logic signal;

wherein, the first logic signal is a logic operation result based simultaneously on a first delay signal and the second gate control signal, the first delay signal being a delayed signal of the second gate control signal, and the second logic signal is a logic operation result based simultaneously on a second delay signal and the first gate control signal, the second delay signal being a delayed signal of the first gate control signal.

2. The pulse generation circuit of claim 1, wherein the logic circuit keeps the level of the first gate control signal regardless of whether or not the control signal transits during a period from the second gate control signal transiting from low level to high level to the first delay signal transiting from low level to high level, and the logic circuit keeps the level of the second gate control signal regardless of whether or not the control signal transits during a period from the first gate control signal transiting from high level to low level to the second delay signal transiting from high level to low level.

3. The pulse generation circuit of claim 1, wherein the logic circuit comprises:
   a first logic unit, coupled to the gate of the PMOS, for generating the first gate control signal according to the control signal, the first logic signal, and the first delay signal;
   a second logic unit, coupled to the gate of the NMOS, for generating the second gate control signal according to the control signal, the second logic signal, and the second delay signal;
   a first delay unit, coupled to the gate of the PMOS, for delaying the first gate control signal to generate the second delay signal;
   a second delay unit, coupled to the gate of the NMOS, for delaying the second gate control signal to generate the first delay signal; and
   a third logic unit, coupled to the first logic unit, the second logic unit, the first delay unit, the second delay unit, the gate of the PMOS, and the gate of the NMOS, for generating the first logic signal according to the first delay signal and the second gate control signal and generating the second logic signal according to the second delay signal and the first gate control signal.

4. The pulse generation circuit of claim 3, wherein the third logic unit comprises:
   a first sub-logic unit for generating the first logic signal that indicates a first delay time between the second gate control signal and the first delay signal; and
   a second sub-logic unit for generating the second logic signal that indicates a second delay time between the first gate control signal and the second delay signal;
   wherein, during the first delay time the first logic unit keeps the level of the first gate control signal regardless of whether or not the control signal transits and during the second delay time the second logic unit keeps the level of the second gate control signal regardless of whether or not the control signal transits.

5. The pulse generation circuit of claim 4, wherein the first sub-logic unit is an SR latch, having a set input coupled to receive the second gate control signal, a reset input coupled to receive the first delay signal, and an in-phase output outputting the first logic signal.

6. The pulse generation circuit of claim 4, wherein the first sub-logic unit is a D Flip Flop, having a clock input coupled to receive the first delay signal, a data input coupled to a reference voltage level, a set input coupled to receive the second gate control signal, and an in-phase output outputting the first logic signal.

7. The pulse generation circuit of claim 4, wherein the second sub-logic unit is an SR latch, having a set input coupled to receive an inverse of the first gate control signal, a reset input coupled to receive an inverse of the second delay signal, and an in-phase output outputting an inverse of the second logic signal.

8. The pulse generation circuit of claim 4, wherein the second sub-logic unit is a D Flip Flop, having a clock input coupled to receive an inverse of the second delay signal, a data input coupled to a reference voltage level, a set input coupled to receive an inverse of the first gate control signal, and an in-phase output outputting an inverse of the second logic signal.

9. A DC voltage generation circuit for generating a DC voltage, comprising:
   a low-pass filter, having an input terminal and an output terminal, for filtering a pulse signal to generate the DC voltage, which is outputted at the output terminal;
   a PMOS, having a source coupled to a first reference voltage level, a drain coupled to the input terminal of the low-pass filter, a gate coupled to receive a first gate control signal, the pulse signal being generated at the drain of the PMOS;
   an NMOS, having a source coupled to a second reference voltage level, a drain coupled to the input terminal of the low-pass filter, and a gate coupled to receive a second gate control signal, the pulse signal being generated at the drain of the NMOS; and
   a logic circuit, coupled to the gate of the PMOS and the gate of the NMOS, for generating the first gate control signal according to a control signal and a first logic signal and generating the second gate control signal according to the control signal and a second logic signal;
   wherein, the first logic signal is related to a first delay signal and the second gate control signal, the first delay signal being a delayed signal of the second gate control signal, and the second logic signal is related to a second delay signal and the first gate control signal, the second delay signal being a delayed signal of the first gate control signal;
   wherein, the logic circuit keeps the level of the first gate control signal regardless of whether or not the control signal transits during a period from the second gate control signal transiting from low level to high level to the first delay signal transiting from low level to high level, and the logic circuit keeps the level of the second gate control signal regardless of whether or not the control signal transits during a period from the first gate control signal transiting from high level to low level to the second delay signal transiting from high level to low level.

10. The DC voltage generation circuit of claim 9, wherein the logic circuit comprises:
    a first logic unit, coupled to the gate of the PMOS, for generating the first gate control signal according to the control signal, the first logic signal, and the first delay signal;
    a second logic unit, coupled to the gate of the NMOS, for generating the second gate control signal according to the control signal, the second logic signal, and the second delay signal;

a first delay unit, coupled to the gate of the PMOS, for delaying the first gate control signal to generate the second delay signal;

a second delay unit, coupled to the gate of the NMOS, for delaying the second gate control signal to generate the first delay signal; and a third logic unit, coupled to the first logic unit, the second logic unit, the first delay unit, the second delay unit, the gate of the PMOS, and the gate of the NMOS, for generating the first logic signal according to the first delay signal and the second gate control signal and generating the second logic signal according to the second delay signal and the first gate control signal.

11. The DC voltage generation circuit of claim 10, wherein the third logic unit comprises:

a first sub-logic unit for generating the first logic signal that indicates a first delay time between the second gate control signal and the first delay signal; and a second sub-logic unit for generating the second logic signal that indicates a second delay time between the first gate control signal and the second delay signal;

wherein, during the first delay time the first logic unit keeps the level of the first gate control signal regardless of whether or not the control signal transits and during the second delay time the second logic unit keeps the level of the second gate control signal regardless of whether or not the control signal transits.

12. The DC voltage generation circuit of claim 11, wherein the first sub-logic unit is an SR latch, having a set input coupled to receive the second gate control signal, a reset input coupled to receive the first delay signal, and an in-phase output outputting the first logic signal.

13. The DC voltage generation circuit of claim 11, wherein the first sub-logic unit is a D Flip Flop, having a clock input coupled to receive the first delay signal, a data input coupled to a reference voltage level, a set input coupled to receive the second gate control signal, and an in-phase output outputting the first logic signal.

14. The DC voltage generation circuit of claim 11, wherein the second sub-logic unit is an SR latch, having a set input coupled to receive an inverse of the first gate control signal, a reset input coupled to receive an inverse of the second delay signal, and an in-phase output outputting an inverse of the second logic signal.

15. The DC voltage generation circuit of claim 11, wherein the second sub-logic unit is a D Flip Flop, having a clock input coupled to receive an inverse of the second delay signal, a data input coupled to a reference voltage level, a set input coupled to receive an inverse of the first gate control signal, and an in-phase output outputting an inverse of the second logic signal.

16. A DC voltage generation circuit for generating a DC voltage, comprising:

a low-pass filter, having an input terminal and an output terminal, for filtering a pulse signal to generate the DC voltage, which is outputted at the output terminal;

a PMOS, having a source coupled to a first reference voltage level, a drain coupled to the input terminal of the low-pass filter, a gate coupled to receive a first gate control signal, the pulse signal being generated at the drain of the PMOS;

an NMOS, having a source coupled to a second reference voltage level, a drain coupled to the input terminal of the low-pass filter, and a gate coupled to receive a second gate control signal, the pulse signal being generated at the drain of the NMOS; and a logic circuit, coupled to the gate of the PMOS and the gate of the NMOS, for generating the first gate control signal according to a control signal and a first logic signal and generating the second gate control signal according to the control signal and a second logic signal;

wherein, the first logic signal is related to a first delay signal and the second gate control signal, the first delay signal being a delayed signal of the second gate control signal, and the second logic signal is related to a second delay signal and the first gate control signal, the second delay signal being a delayed signal of the first gate control signal;

wherein, the logic circuit comprises:

a first logic unit, coupled to the gate of the PMOS, for generating the first gate control signal according to the control signal, the first logic signal, and the first delay signal;

a second logic unit, coupled to the gate of the NMOS, for generating the second gate control signal according to the control signal, the second logic signal, and the second delay signal;

a first delay unit, coupled to the gate of the PMOS, for delaying the first gate control signal to generate the second delay signal;

a second delay unit, coupled to the gate of the NMOS, for delaying the second gate control signal to generate the first delay signal; and a third logic unit, coupled to the first logic unit, the second logic unit, the first delay unit, the second delay unit, the gate of the PMOS, and the gate of the NMOS, for generating the first logic signal according to the first delay signal and the second gate control signal and generating the second logic signal according to the second delay signal and the first gate control signal.

17. The DC voltage generation circuit of claim 16, wherein the third logic unit comprises:

a first sub-logic unit for generating the first logic signal that indicates a first delay time between the second gate control signal and the first delay signal; and a second sub-logic unit for generating the second logic signal that indicates a second delay time between the first gate control signal and the second delay signal;

wherein, during the first delay time the first logic unit keeps the level of the first gate control signal regardless of whether or not the control signal transits and during the second delay time the second logic unit keeps the level of the second gate control signal regardless of whether or not the control signal transits.

18. The DC voltage generation circuit of claim 17, wherein the first sub-logic unit is an SR latch, having a set input coupled to receive the second gate control signal, a reset input coupled to receive the first delay signal, and an in-phase output outputting the first logic signal.

19. The DC voltage generation circuit of claim 17, wherein the first sub-logic unit is a D Flip Flop, having a clock input coupled to receive the first delay signal, a data input coupled to a reference voltage level, a set input coupled to receive the second gate control signal, and an in-phase output outputting the first logic signal.

* * * * *